(12) United States Patent
Tan et al.

(10) Patent No.: US 11,322,886 B2
(45) Date of Patent: May 3, 2022

(54) CONNECTOR ASSEMBLY

(71) Applicant: Hewlett Packard Enterprise Development LP, Houston, TX (US)

(72) Inventors: Chong S. Tan, Spring, TX (US); Joseph Allen, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 25 days.

(21) Appl. No.: 16/947,211

(22) Filed: Jul. 23, 2020

(65) Prior Publication Data

US 2022/0029352 A1 Jan. 27, 2022

(51) Int. Cl.
*H01R 43/26* (2006.01)
*H01R 13/627* (2006.01)
*H01R 13/516* (2006.01)

(52) U.S. Cl.
CPC ....... *H01R 13/6275* (2013.01); *H01R 13/516* (2013.01); *H01R 43/26* (2013.01)

(58) Field of Classification Search
CPC ... H01R 13/44; H01R 2201/26; H01R 13/447
See application file for complete search history.

(56) References Cited

U.S. PATENT DOCUMENTS

| | | | | |
|---|---|---|---|---|
| 3,094,364 A | * | 6/1963 | Liagg | H01R 13/629 439/247 |
| 3,651,444 A | * | 3/1972 | Desso | H01R 13/4538 439/141 |
| 3,951,500 A | * | 4/1976 | Anderson | H01R 13/631 439/248 |
| 4,580,862 A | * | 4/1986 | Johnson | H01R 24/52 439/248 |
| 4,697,859 A | * | 10/1987 | Fisher, Jr. | H01R 13/6315 439/246 |
| 5,235,474 A | * | 8/1993 | Searle | G11B 15/6815 360/71 |
| 5,616,038 A | * | 4/1997 | Okamoto | H01R 13/62933 439/157 |
| 6,792,675 B2 | | 9/2004 | Tran | |

(Continued)

FOREIGN PATENT DOCUMENTS

| | | |
|---|---|---|
| CN | 201112913 Y | 9/2008 |
| CN | 102013597 A | 4/2011 |

(Continued)

*Primary Examiner* — Truc T Nguyen
(74) *Attorney, Agent, or Firm* — Hewlett Packard Enterprise Patent Department

(57) ABSTRACT

Examples described herein relate to connector assembly for a connecting device. The connector assembly may include an electrical connector connectible with a corresponding receiving structure on a receiving device separate from the connecting device. Further, the connector assembly may include a connector housing enclosing the electrical connector. The connector housing may include a mounting lever engaged with a body of the connecting device to secure the connector housing with the connecting device and allow the connector housing to move relative to the body of the connecting device. Further, the connector assembly may include a biasing member disposed within the connector housing to bias the electrical connector toward the receiving structure on the receiving device.

20 Claims, 11 Drawing Sheets

(56) References Cited

U.S. PATENT DOCUMENTS

| | | | |
|---|---|---|---|
| 7,124,505 B2 * | 10/2006 | Friesen | H01R 13/6215 |
| | | | 29/876 |
| 7,614,897 B2 * | 11/2009 | Lopez | H01R 13/516 |
| | | | 439/248 |
| 8,926,352 B2 | 1/2015 | Wang et al. | |
| 9,570,851 B2 * | 2/2017 | Rauscent | H01R 13/6315 |
| 2019/0103688 A1 * | 4/2019 | Pandya | H01R 13/114 |

FOREIGN PATENT DOCUMENTS

| | | |
|---|---|---|
| CN | 202159839 U | 3/2012 |
| CN | 102403620 A | 4/2012 |
| CN | 102623841 A | 8/2012 |

* cited by examiner

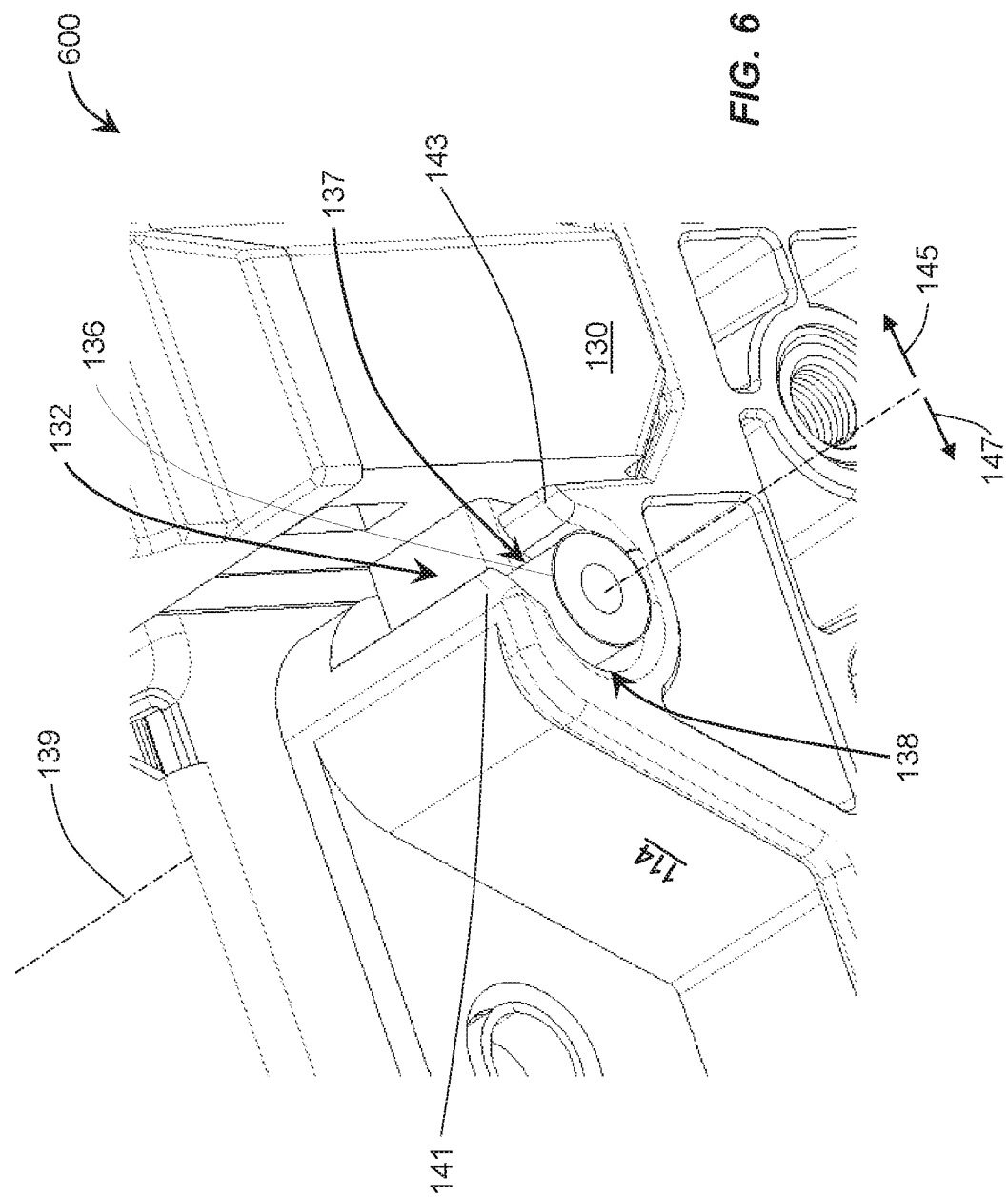

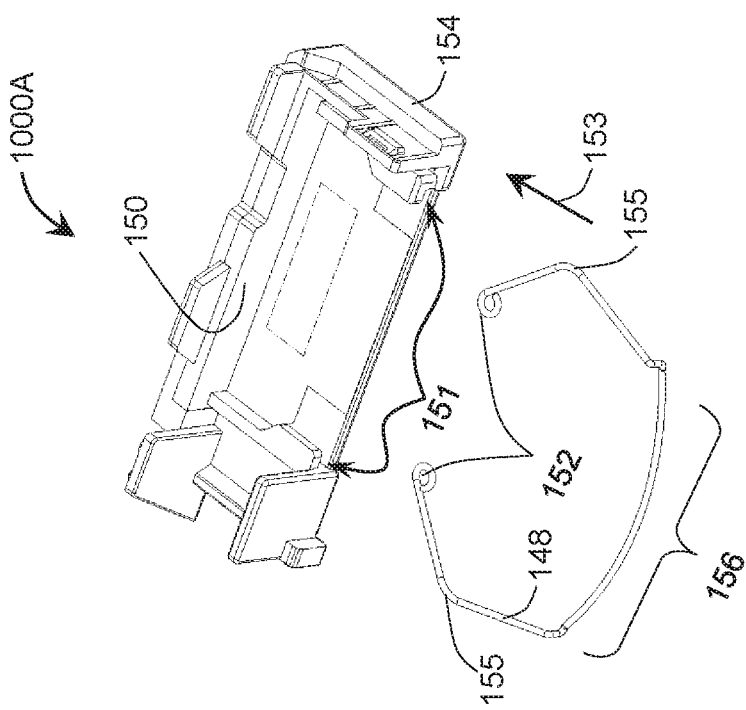
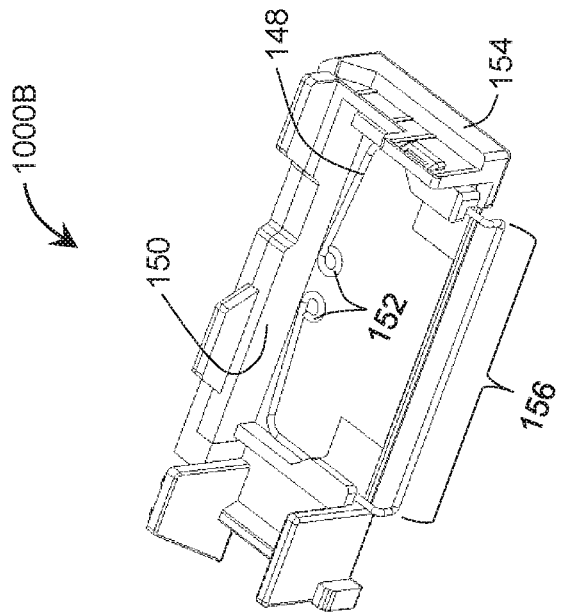

CONNECTOR ASSEMBLY

BACKGROUND

Computing systems, for example, storage systems, servers, edge-computing systems, and the like, may include several electronic devices that are installed on a motherboard. The motherboard may include a printed circuit board having several electronic devices (e.g., integrated circuits, resistors, capacitors, transistors, diodes) disposed thereon. Further, the motherboard may also include certain receiving connectors I sockets to receive any additional electronic devices. For example, electronic devices such as, but not limited to, additional integrated circuits, power supply modules, and storage modules having one or more storage devices may be removably coupled to the motherboard via the receiving connectors. Moreover, modern-day computing systems offer increased modularity to accept variety of electronic devices to be removably connected to the motherboards via certain industry standard connectors.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein:

FIG. 6 depicts a perspective view showing an engagement of a connector housing with a body of the connecting device, in accordance with an example;

FIG. 10A depicts an exploded internal perspective view of the connector assembly showing a connector housing portion and a biasing member separately, in accordance with an example;

FIG. 10B depicts an internal perspective view of the connector assembly showing a placement of a biasing member in a connector housing portion, in accordance with an example;

Figure 1:
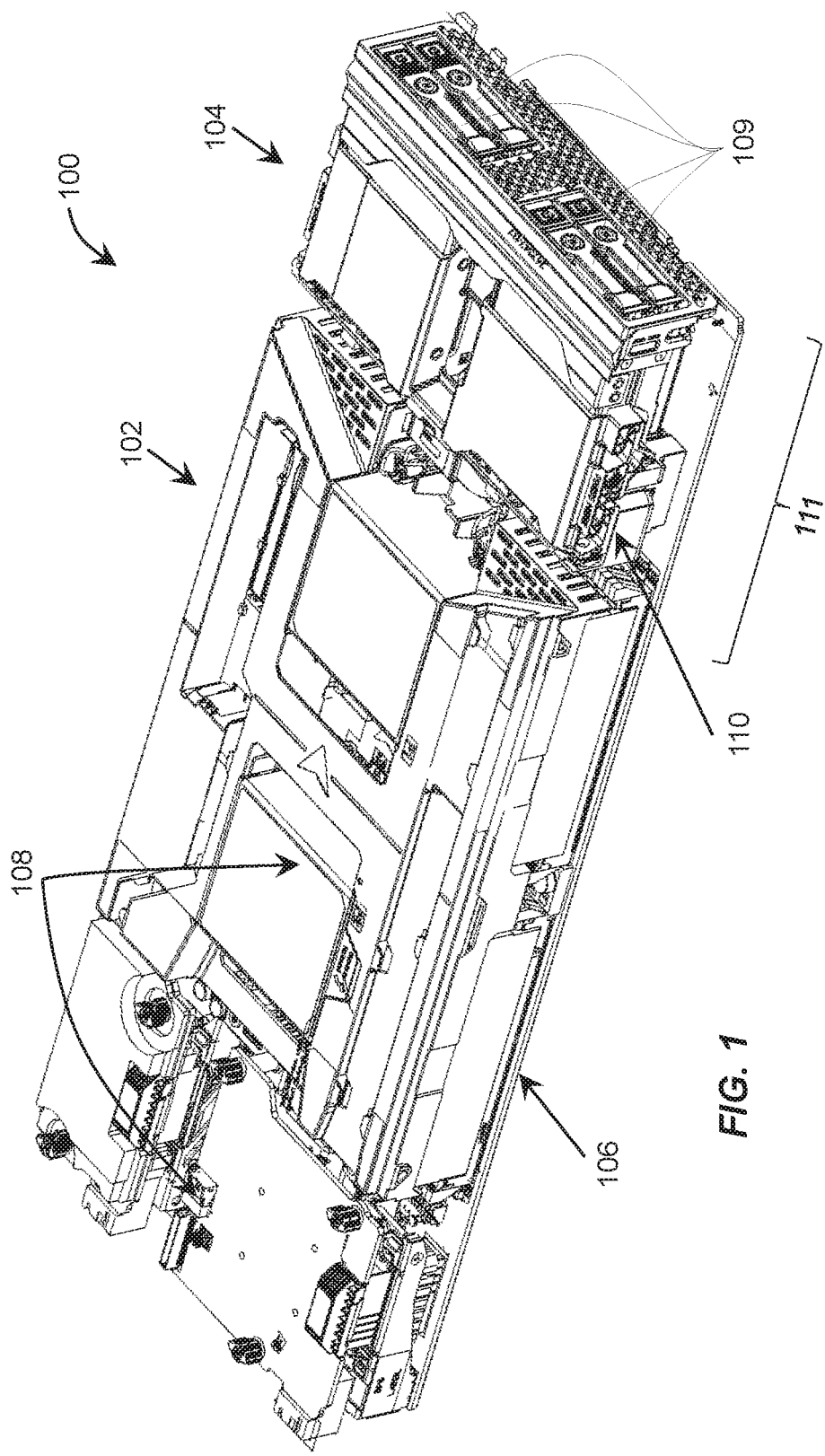
FIG. 1 depicts a perspective view of a system, in accordance with an example.

It is emphasized that, in the drawings, various features are not drawn to scale. In fact, in the drawings, the dimensions of the various features have been arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "coupled," as used herein, is defined as connected, whether directly without any intervening elements or indirectly with at least one intervening element, unless indicated otherwise. For example, two elements may be coupled mechanically, electrically, magnetically, or communicatively linked through a communication channel, pathway, network, or system. Further, the term "and/or" as used herein refers to and encompasses any and all possible combinations of the associated listed items. It will also be understood that, although the terms first, second, third, fourth, fifth, sixth, seventh, eighth, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

Computing systems, for example, storage systems, servers, edge-computing systems, and the like, may include several electronic devices that are installed on a motherboard. The motherboard may include a printed circuit board having several electronic devices (e.g., integrated circuits, resistors, capacitors, transistors, diodes) disposed thereon. Further, the motherboard may also include certain receiving connectors/sockets to receive any additional electronic devices. For example, electronic devices such as, but not limited to, additional integrated circuits, power supply modules, and storage modules having one or more storage devices may be removably coupled to the motherboard via the receiving connectors. Moreover, modern-day computing systems offer increased modularity to accept variety of electronic devices to be removably connected to the motherboards via certain industry standard connectors.

A device capable of being removably coupled to the motherboard may typically include a connector to couple the device with a corresponding receiving counterpart (e.g., a receiving connector or socket) disposed on the motherboard. Further, certain devices that are removably coupled to the motherboard may be housed in a metallic or plastic body that houses the several electronic components. For example, a storage module may include one or more storage devices (e.g., hard drives) housed within an enclosure/housing. During manufacturing of such devices, there may exist certain tolerances in the dimensions of the enclosures and/or the connector through which the device can be coupled to the corresponding receiving counterpart on the motherboard.

In the field of operation, some devices may be manually installed on the motherboard, where in certain instances, the tolerances in the dimensions of the enclosure and/or the connector may cause faulty installation of the device on the motherboards due to any misalignment. Moreover, in some cases, due to such misalignment, several efforts may be made to re-install the device on the motherboard, The misalignments and such several unsuccessful attempts to install the device may cause wear and tear, and in some instances, damages, to the connector and/or the corresponding counterpart on the motherboard. The damages, wear and tear may lead to costly replacement of the parts, in some instances.

Further, due to advances in the technology, clock speeds at which modern-day electronic devices are operating have also increased. Accordingly, height (or length) of connecting fingers on connectors and the receptacles on the counterpart have reduced drastically (e.g., up-to 1.2 mm or less). Such a low height of the connecting fingers may cause the connector to decouple from the counterpart on the motherboard. Alternatively, to avoid such decoupling, the connectors may include fasteners (e.g., screws) to couple the connector with the counterpart. Such installation may require tools to enable a mechanical coupling between the connector and the counterpart while still being susceptible to damages, wear and tear caused due to any misalignment.

Examples disclosed herein address these technological issues by disposing a connector in a connector housing that is movable with respect to a body of connecting device and by using a biasing member and to retain the connector in contact with a receiving structure when the connecting device is connected to a receiving device. For example, the connector assembly as presented herein may include a connector connectible with a corresponding receiving structure on a receiving device separate from the connecting device. Further, the connector assembly may include connector housing enclosing the connector. The connector housing may include a mounting lever engaged with a body of the connecting device to secure the connector housing with the connecting device and allow the connector housing to move relative to the body of the connecting device. The connector assembly may also include a biasing member disposed within the connector housing to bias the connector toward the receiving structure on the receiving device.

The connector may be disposed in the connector housing that is movable relative to the body of the connecting device. Such connector housing may provide certain degree of freedom (e.g., movement in an X-Y direction) to adjust a seating position of the connector which can reduce any wear and tear or damages to the connector and/or the receiving structure on the receiving device (e.g., motherboard). Additionally, use of the biasing member may ensure a tight coupling between the connector and the receiving structure when the connecting device is installed in the receiving device. As such, the biasing member may provide a biasing force in a Z-direction (perpendicular to the X and Y directions). Accordingly, use of the connector assembly enables the connector to be connected to the receiving structure without requiring a separate manual connection of the connector. Moreover, use of the connector assembly enables a tool less secure coupling of the connector.

Referring now to the drawings, in FIG. 1, a perspective view of a system 100 is depicted, in accordance with an example. The system 100 may be a computing system or any other electronic system that may be capable of storing data, processing data, and/or communicating data with external devices. Non-limiting examples of the system 100 may include, but are not limited to, a server, a storage device, a composable infrastructure with compute, storage, and/or networking resources, a network switch, a router, a mobile communication device, a desktop computer, a portable computer, a networked resource enclosure, an edge-computing device, or a WLAN access point. The server may be a blade server, for example. The storage device may be a storage blade, for example.

In some examples, the system 100 may include a receiving device 102 and a connecting device 104. The receiving device 102 may include a printed circuit assembly alternatively referred to as a motherboard 106. The motherboard 106 may include several electronic components and modules 108 that are either permanently attached (e.g., soldered) or removably attached to the motherboard 106. The term "removably attached" or "removably coupled" as used herein may refer to a coupling arrangement between two components that allows the coupled components to be decoupled and coupled again when desired. In some implementations, certain electronic components, such as resistors, diodes, transistors, integrated circuits, may be permanently soldered to the motherboard 106. However, certain devices, for example, memory modules such as random access memory (RAM) chips may be removably coupled on the motherboard 106 on a respective chip socket.

Moreover, the connecting device 104 may refer to a device that can be removably coupled to the motherboard 106 to enhance various capabilities of the system 100. By way of example, the connecting device 104 may be a storage module, a compute module, a networking module, a communication module, power supply module, a cooling module, and the like. In some other examples, the connecting device 104 may be any electronic device capable of being coupled to the receiving device 102. The connecting device 104 may be able to establish data and/or power transfer with the motherboard 106 when coupled to the motherboard 106. In the description hereinafter, for illustration purposes, the connecting device 104 is described as a storage module including a plurality of storage devices 109 (e.g., hard disk drives, solid-state drives, etc.). Additional details of the connecting device 104 are described in conjunction with FIG. 3.

In some examples, the connecting device 104 may be coupled to the motherboard 106 such that electrical and/or data communication may be established between the receiving device 102 and the connecting device 104. For example, if the connecting device 104 is a storage module, when the connecting device 104 is coupled to the motherboard 106, electrical and/or data communication may be established between any compute resource (e.g., processor, not shown) disposed on the motherboard 106 and one or more storage devices 109 of the storage module. The electrical and/or data communication between the receiving device 102 and the connecting device 104 may be established via connectors. For example, the connecting device 104 may be equipped with a connector (see FIG. 4) and the receiving device 102 may include corresponding receiving structure (see FIG. 2).

In accordance with aspects of the present disclosure, the connecting device 104 may include a connector assembly 110 that may house the connector and facilitate electrical and/or data communication between the receiving device 102 and the connecting device 104 while reducing wear and tear or damages to the connector and/or the receiving structure on the receiving device 102. Moreover, the connector assembly 110 may also facilitate a tool less secure coupling between the receiving device 102 and the connecting device 104 without use of extra fixtures (e.g., screws). Additional details of the connector assembly 110 will be described in conjunction with FIGS. 3-11.

Figure 2:
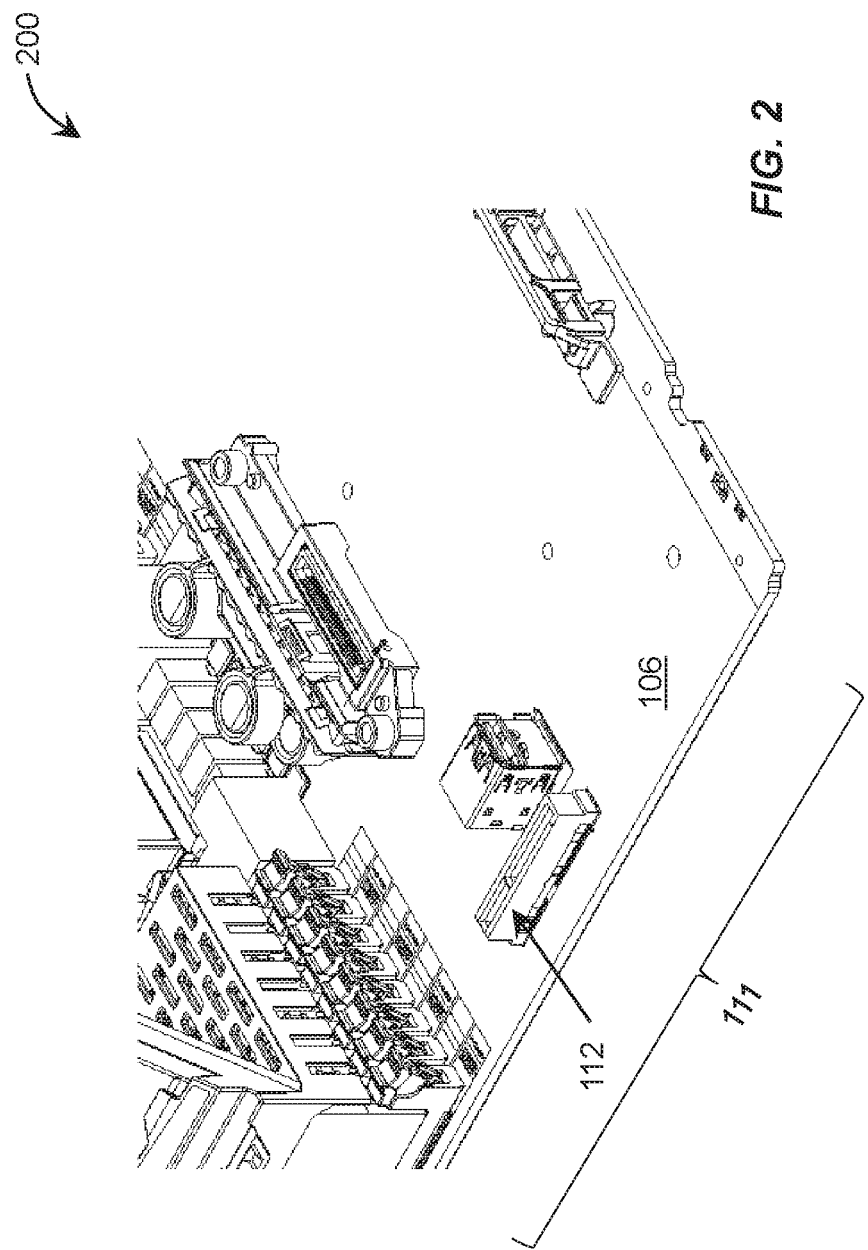
FIG. 2 depicts a perspective view of a portion of a receiving device of the system of FIG. 1, in accordance with an example.

Referring now to FIG. 2, a perspective view 200 of a portion 111 of the receiving device 102 of the system 100 of FIG. 1 is depicted, in accordance with an example. As depicted in FIG. 2, in the portion 111 of the receiving device 102 may be a region of the motherboard 106 that receives the connecting device 104. The connecting device 104 may be disposed on the motherboard 106 so that the electrical and/or data communication may be established between the receiving device 102 and the connecting device 104. By way of example, the motherboard 106 may include a receiving structure 112 to which the connector assembly 110 may be coupled to when the connecting device 104 may be disposed on the motherboard 106. Accordingly, a position of the connector assembly 110 on the connecting device 104 may be arranged so that the connector assembly 110 is aligned with a position of the receiving structure 112 on the motherboard 106, and vice-versa.

In some examples, a profile of the receiving structure 112 may be selected so that when the connecting device 104 is disposed on the motherboard 106, the connector (see FIG. 4) of the connector assembly 110 may be engaged with the receiving structure 112. For example, if the connector of the connector assembly 110 is a male-type plug, the receiving structure 112 may be a corresponding female-type receiver socket. For illustration purposes, in the example of FIG. 2, the receiving structure 112 is shown to be a TA-1002 female-type receiver socket. In some examples, the receiving structure 112 may include a plurality of receptacles that may contact corresponding connecting fingers (described later) on the connector of the connector assembly 110.

Figure 3:
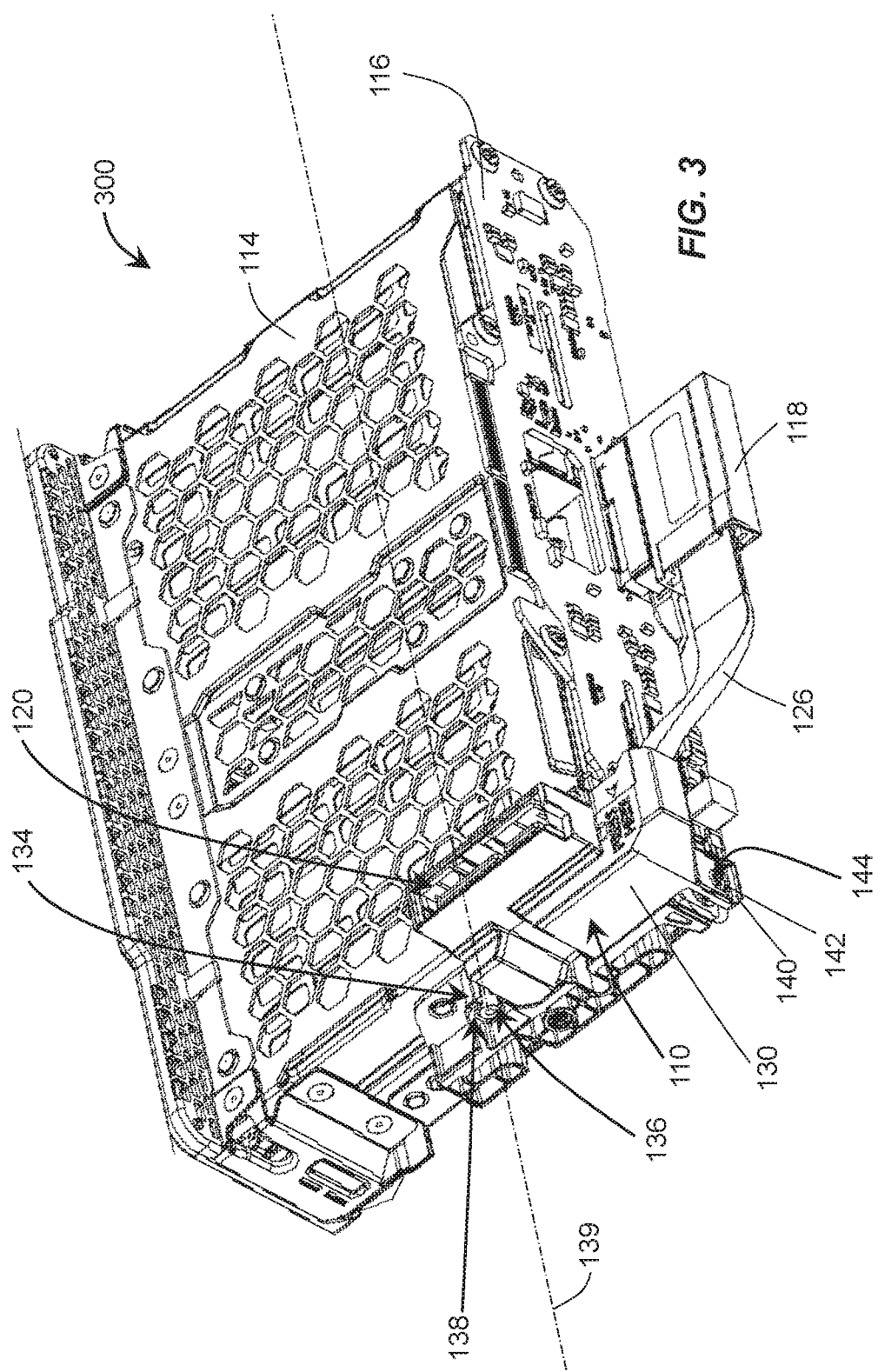
FIG. 3 depicts a perspective view of a connecting device disposed in the system of FIG. 1, in accordance with an example.

Moving now to FIG. 3, a perspective view 300 of the connecting device 104 having the connector assembly 110 is depicted, in accordance with an example. Further, FIGS. 4-8 depicting additional features of the connector assembly 110 are also described concurrently with the description of FIG. 3 for ease of illustration. As depicted in FIG. 3, the connecting device 104 may include a body 114. The body 114 of the connecting device 104, in some examples, may serve as a housing for several components (e.g., circuit boards, storage devices 109, electronic components, etc.) of the connecting device 104. In certain examples, the body 114 may include several openings, holes, or a mesh-profile to aid in cooling of the components disposed inside the body 114.

Further, in some examples, the connecting device 104 may include a backplane printed circuit assembly (PCA) 116 that may interconnect one or more of the components of the connecting device 104 and/or provide connections of some of the components of the connecting device 104 with external devices (e.g., the motherboard). By way of example, the backplane PCA 116 may include at least one port, such as a port 118 that provide access to the components, for example, one or more storage devices of the connecting device 104. In some examples, the connector assembly 110 may be electrically coupled to the port 118 via a cable 126. The connector assembly 110 may, in-turn, couple the port 118 of the connecting device 104 with the motherboard 106 so that components (e.g., the computing resources) disposed on the motherboard 106 can access the components (e.g., the one or more storage devices) in the connecting device 104.

Figure 4:
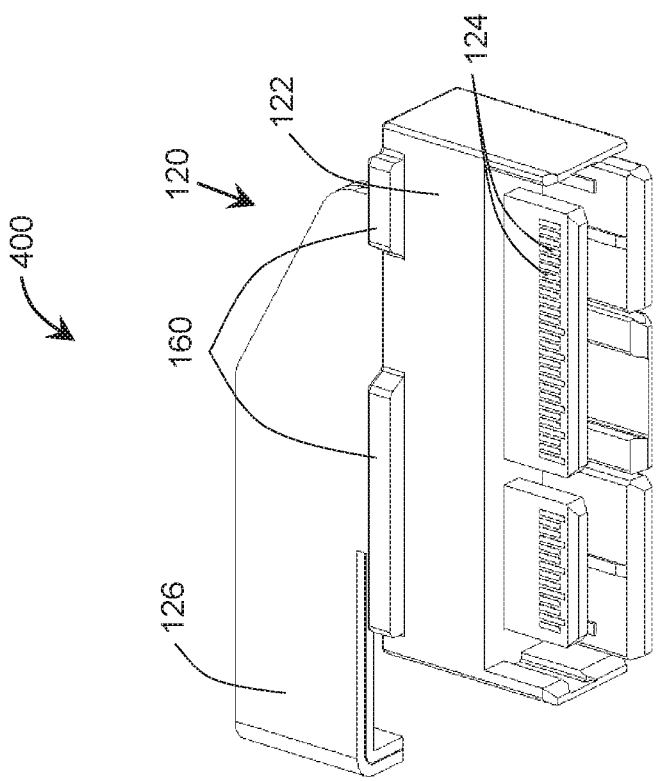
FIG. 4 depicts a perspective view of a connector, in accordance with an example.

In some examples, the connector assembly 110 may include a connector 120. A detailed perspective view 400 of the connector 120 is depicted in FIG. 4, in accordance with one example. The connector 120 may be connectible with the corresponding receiving structure 112 on the receiving device 102. For example, the connector 120 may be selected so that when the connecting device 104 is disposed on the motherboard 106, the connector 120 may be engaged with the receiving structure 112. By way of example, the connector 120 of the connector assembly 110 may be a male-type plug if the corresponding the receiving structure 112 is a female-type receiver socket. Further, if the connecting device 104 is a storage module having a plurality of storage devices 109 (see FIG. 1), the connector 120 may be coupled to at least one storage device of the plurality of storage devices to facilitate data transfer for the at least one storage device. For illustration purposes, in the example of FIGS. 3 and 4, the connector 120 is shown to be a TA-1002 type male plug. Although, the connector 120 is described as being an electrical connector, the connector 120 may as well be an optical connector or any other type of connector without limiting the scope of the present disclosure.

In some examples, as depicted in FIG. 4, the connector 120 may include a connector body 122 and a plurality of connecting fingers 124 that may contact the corresponding receptacle in the receiving structure 112 when the connecting device 104 is disposed on the receiving device 102. In some examples, the connector body 122 may be formed of an electrically insulating material (e.g., plastic) and the connecting fingers 124 may be formed of an electrically conductive material (e.g., metal). Further, in some examples, connector assembly 110 may include the connecting cable 126 that couples the connector 120 with the port 118. In particular, the connecting cable 126 may cause electrical coupling between the port and the connecting fingers 124 in the connector 120.

Figure 5:
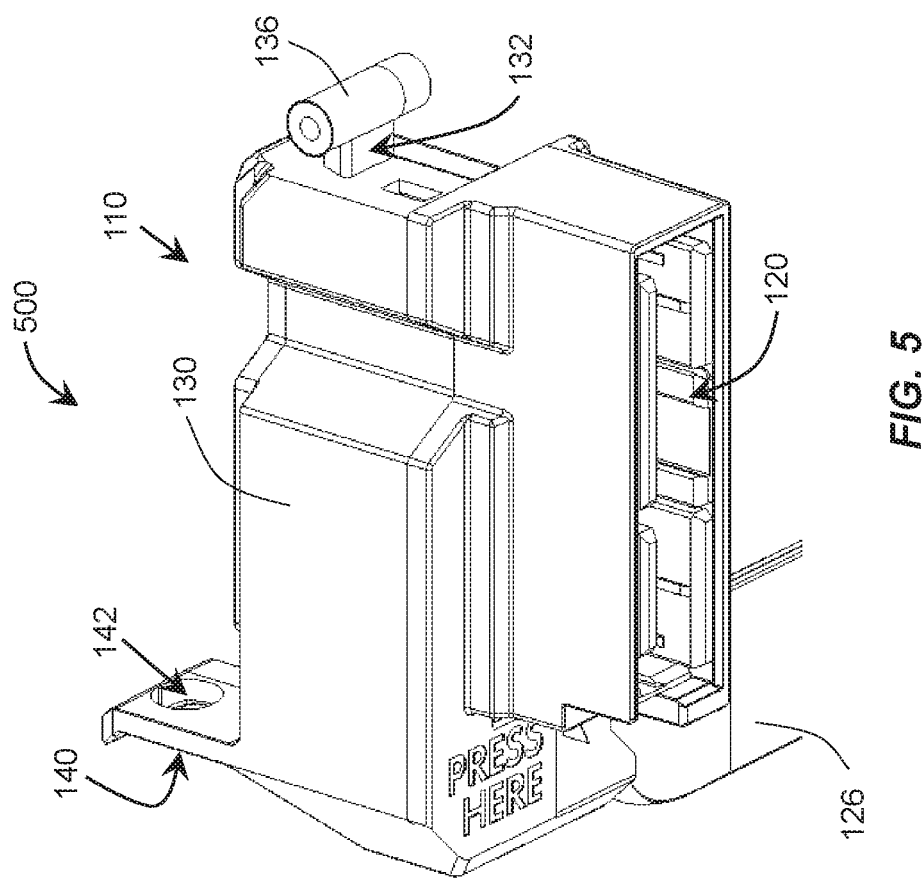
FIG. 5 depicts a perspective view of a connector assembly, in accordance with an example.

Referring to FIGS. 3, 5, and 6 in some examples, the connector assembly 110 may include a connector housing 130. The connector housing 130 may enclose the connector 120. The connector housing 130 may be movably coupled to the body 114 of the connecting device 104. The term "movably coupled" or "movable coupling" may refer to a coupling between two components that allows one component to move relative to another component. For example, the connector housing 130 may be coupled to the body 114 such that the connector housing 130 may move relative to the body 114 while being in engagement with the body 114. To establish such movable coupling, the connector housing 130 may include a mounting lever 132. The mounting lever 132 may be engaged with the body 114 of the connecting device 104 to secure the connector housing 130 with the body 114 of the connecting device 104 such that the connector housing 130 can move relative to the body 114. More particularly, the mounting lever 132 may be engaged with the body 114 at an anchor location 134 on the body 114 and is able to move relative to the anchor location 134 (see FIG. 6).

Figure 7:
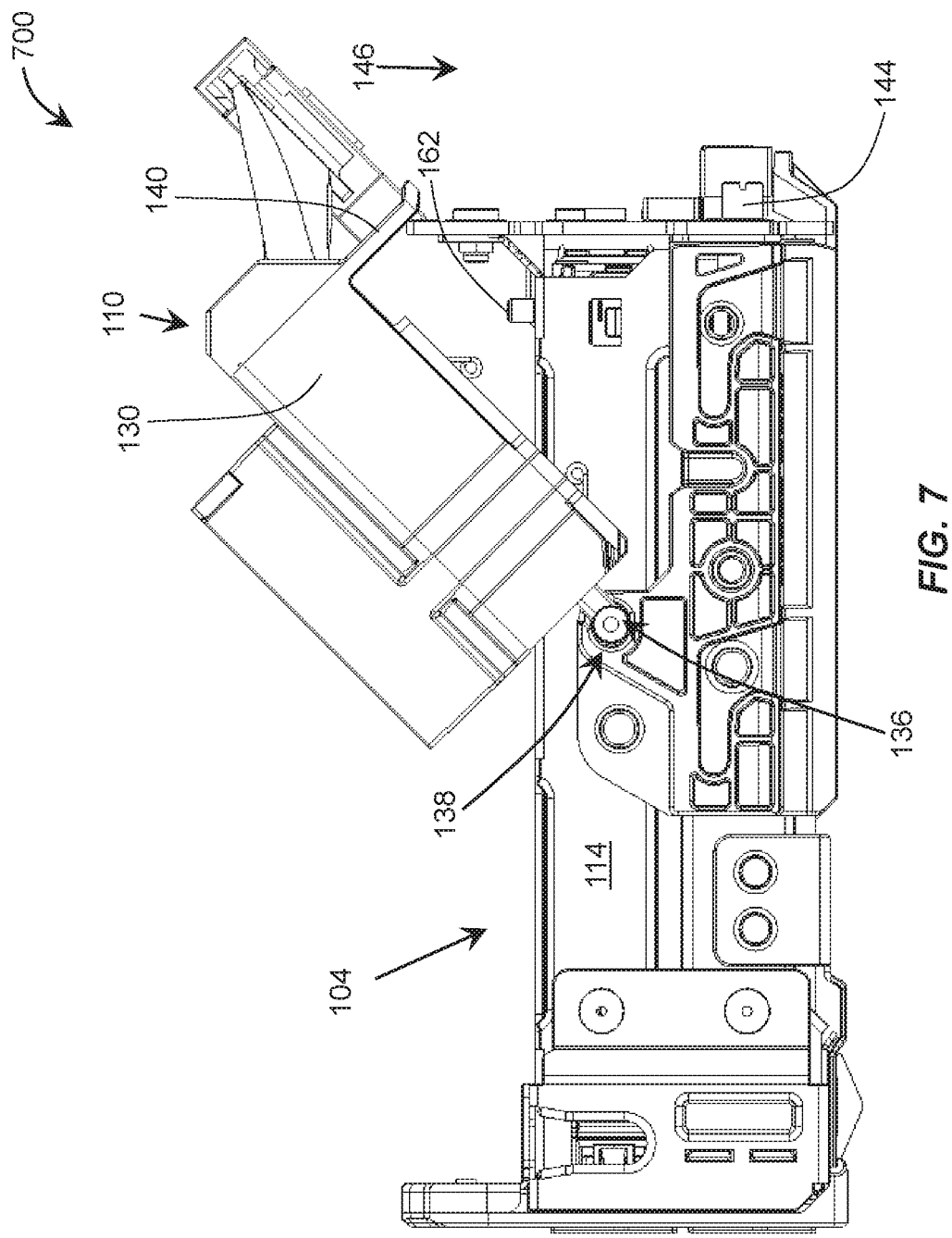
FIG. 7 depicts a perspective view of a connecting device disposed in the system of FIG. 1, in accordance with an example.

In some examples, the mounting lever 132 (see FIGS. 5-9) may include an end section 136 that is movably coupled with the body 114 of the connecting device 104. For example, in perspective views 500, 700, and 900 depicted respectively in FIGS. 5, 7, and 9, the end section of the mounting lever 132 may be a cylindrical end section 136. Further, the body 114 may also have a cylindrical groove 138 at the anchor location 134. The connector housing 130 may be coupled to the body 114 by inserting the cylindrical end section 136 into the cylindrical groove 138. Such engagement of the cylindrical end section 136 with the cylindrical groove 138 may allow an angular movement of the connector housing 130 with respect to a central axis 139 of the cylindrical end section 136. In certain examples, the cylindrical end section 136 and the cylindrical groove 138 may be dimensioned so that the connector housing 130 may be able to rotate with respect to the central axis 139 of the cylindrical end section 136. For instance, an outer diameter of the cylindrical end section 136 may be smaller than an inner diameter of the cylindrical groove 138. By way of example, FIG. 7 depicts one such perspective view 700 of the connecting device 104 where the connector assembly 110 is shown as rotated in comparison to a position of the connector assembly 110 depicted in FIG. 3.

Further, in FIG. 6, the perspective view 600 showing the connecting device 104 disposed in the system 100 of FIG. 1 is depicted, in accordance with an example. For example, the perspective view 600 depicts a detailed view showing engagement between the mounting lever 132 and the groove 138 in the body 114 of the connecting device. In accordance with the aspects of the present application, the mounting lever 132 may be engaged with the body 114 of the connecting device 104 such that the mounting lever 132 can move back and forth, for example, along directions 145 and 147 that are opposite to each other and perpendicular to the central axis 139 of the end section 136. In particular, the groove 138 and/or the end section 136 may be dimensioned such that such movement of the end section 136 along the directions 145 and 147 may be allowable. In one example, to allow such movement of the section 136, the groove 138 may be dimensioned to have an inner diameter greater than a diameter of the section 136. More particularly, the groove 138 may be dimensioned so that there exists some space inside the groove 138 for the end section 136 to travel along the directions 145 and 147. Advantageously, such connector housing 130 having the mounting lever 132 engaged in the groove 138 may provide certain degree of freedom (e.g., movement in an X-Y direction) to adjust a seating position of the connector 120 which can reduce any wear and tear or damages to the connector 120 and/or the receiving structure 112 on the motherboard 106.

Further, in some examples, an opening 137 (e.g., mouth) of the groove 138 defined by faces 141 and 143 is dimensioned such that the mounting lever 132 is retained in the groove 138. In particular, in some examples, a distance between the faces 141 and 143 (e.g., width of the opening) may be kept smaller than the diameter of the end section 136. Hence, the mounting lever 132 may be stopped from being drifted or pulled away in a direction perpendicular to the central axis 139 of the end section 136.

In an alternative implementation, the end section 136 of the mounting lever 132 may include an opening (not shown). In such an implementation, the end section 136 may be coupled to the body 114 of the connecting device 104 using a fixture passing through the opening in the end section 136 and reaching into the body 114 of the connecting device 104. By way of example, the fixture may be a pin or a nail with a head section and an elongated body having a tail section. The head section may have larger cross-sectional area than the rest of the body of the pin. The pin may be inserted in the opening formed in the end section 136 such that the tail section of the fixture is inserted into and secured with the body 114 at the anchor location 134. Once the fixture is installed as described hereinabove, the head section of the fixture may restrict an axial movement of the mounting lever 132 along the central axis 139 of the end section 136. Further, an outer diameter of the elongated body of the fixture may be smaller than an inner diameter of the opening formed in the end section 136 so that when the fixture is inserted in the opening, the connector housing 130 may have angular movement with respect to the fixture.

Referring back to FIGS. 3 and 5, in some examples, the connector housing 130 may include a latch lever 140. The latch lever 140 may be located on an opposite side of the mounting lever 132. The latch lever 140 may be removably snap-fitted to the body 114 of the connecting device 104 to facilitate additional securing of the connector assembly 110 with the body 114. In some examples, to aid in such snap fitting, the latch lever 140 may include a latch opening 142. Further, the body 114 may also be provisioned with a latch protrusion 144 (also shown in FIG. 7). In one example, the latch protrusion 144 may be formed via an extended part of the body 114. In another example, the latch protrusion 144 may be a screw inserted into the body 114 that aligns with the latch opening 142 when the connector assembly 110 is brought closure to the latch protrusion 144 by rotating the connector housing 130. Further, when a force is applied on the connector housing 130 in a direction 146, the latch lever 140 may be snap-fitted to the body 114 of the connecting device 104, as depicted in FIG. 3.

Figure 8:
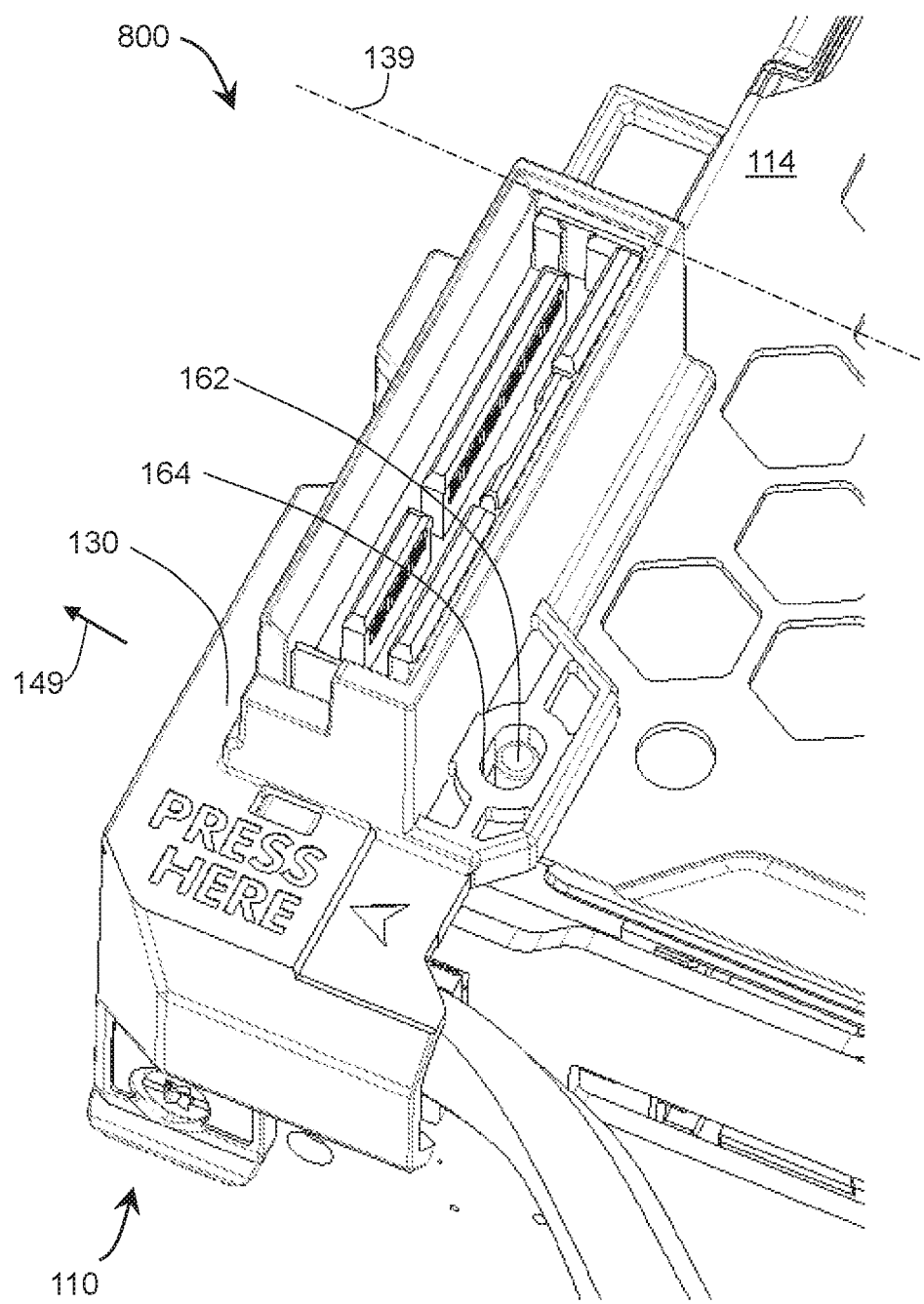
FIG. 8 depicts a perspective view of a portion of the connecting device depicting a locking arrangement, in accordance with an example.

Additionally, as depicted in a perspective view 800 of FIG. 8 and the perspective view 700 of FIG. 7, the connecting device 104 may be provisioned to have a locking arrangement to stop the connector assembly 110 from being drifted away from the groove 138, for example along the central axis 139 in the direction 149. To effect such locking, the body 114 of the connecting device 104 may include a locking protrusion 162 and the connector housing 130 may include an opening 164 that may align with the locking protrusion 162 when the latch lever 140 engages with the latch protrusion 144 (see FIG. 8). Accordingly, when the latch lever 140 engages with the latch protrusion 144, the locking protrusion 162 may be inserted into the opening 164. Such engagement of the locking protrusion 162 with the opening 164 may minimize the movement of the connector assembly 110 in the direction 149 such that the mounting lever 132 remains engaged with the groove 138 and the body 114 of the connecting device.

Figure 9:
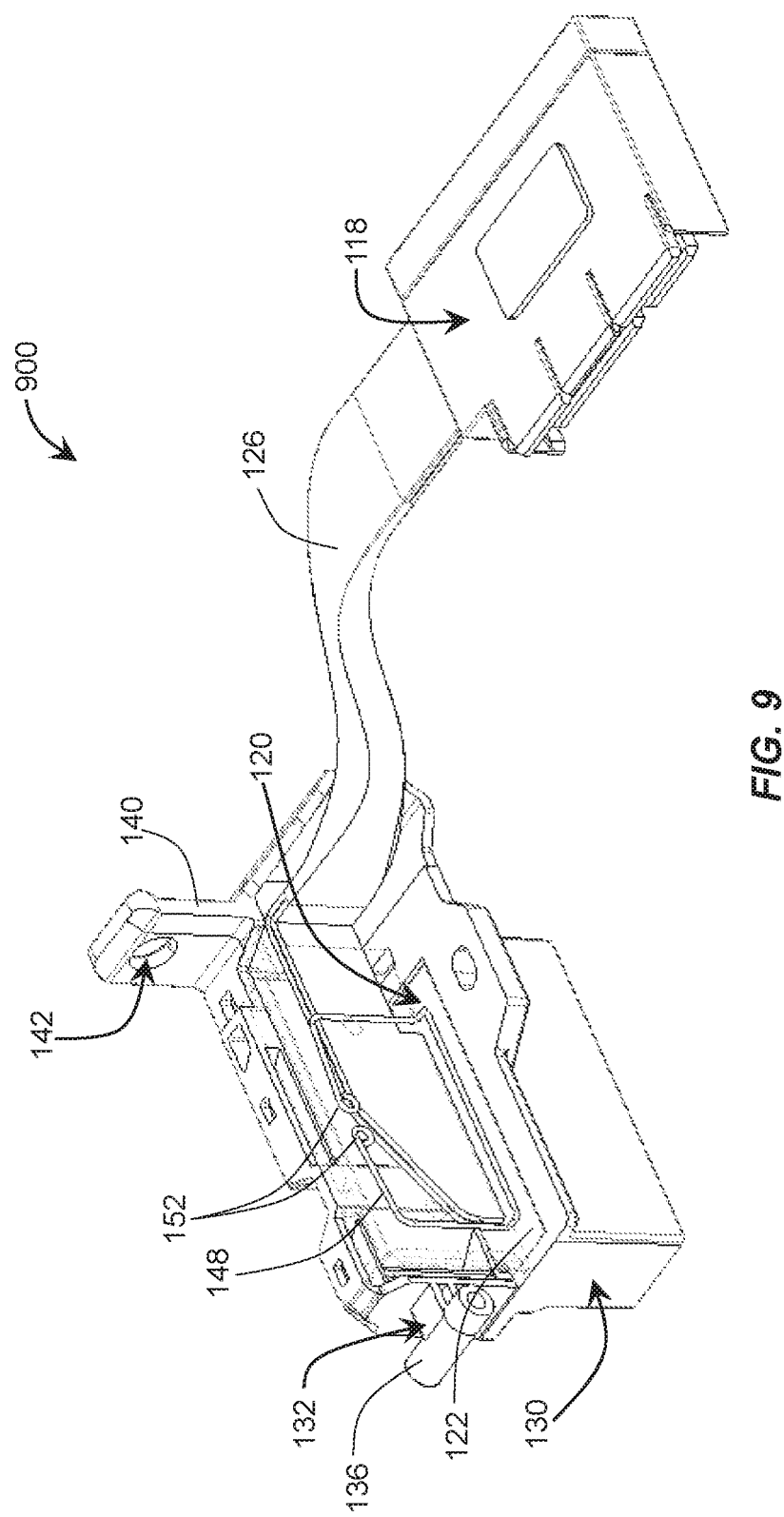
FIG. 9 depicts another perspective view of the connector assembly of FIG. 6, in accordance with an example.
Figure 11:
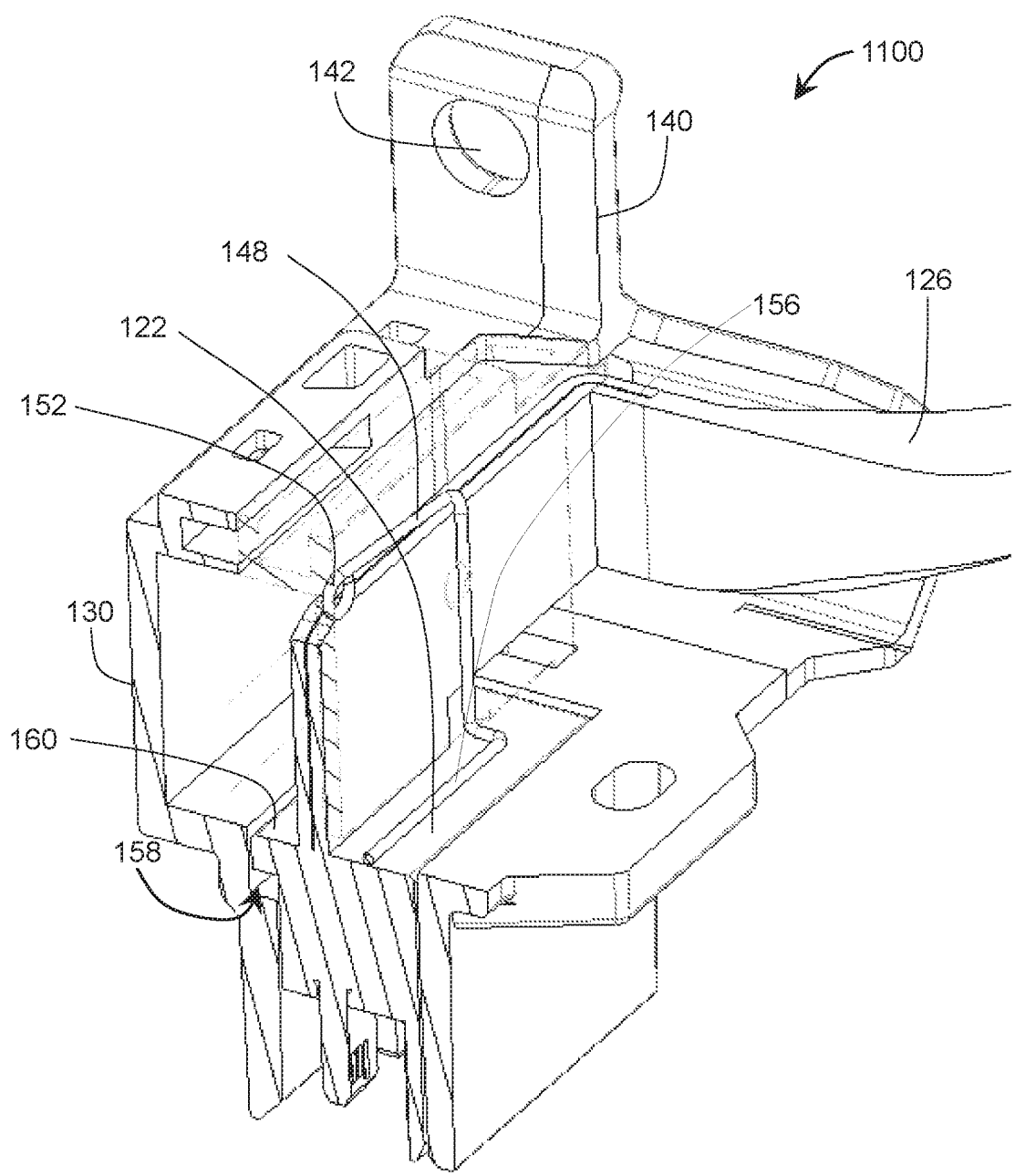
FIG. 11 depicts another internal cross-sectional perspective view of the connector assembly showing a positioning arrangement of a biasing member, in accordance with an example.

Furthermore, in some examples, the connector assembly 110 may include a biasing member 148 to bias the connector 120 toward the receiving structure 112 when the connecting device 104 is disposed on the receiving device 102. FIGS. 9, 10A-10B, and 9 respectively depict perspective views 900, 1000A, 1000B, and 1100 depicting arrangement of the biasing member 148 in the connector assembly 110, in accordance with some examples. For ease of illustration, FIGS. 9-11 are referenced concurrently in the description hereinafter. Further, to depict a placement of the biasing member 148, a portion of the connector housing 130 is not shown in the perspective view 900 of FIG. 9. Such portion of the connector housing that is missing or not shown in FIG. 9 is depicted as a connector housing portion 154 in FIGS. 10A and 10B. Examples of the biasing member 148 may include, but are not limited to, coil springs, one or more bent wires, rubber blocks, or combinations thereof. For illustration purposes, in FIGS. 9-11, the connector assembly 110 is shown to include a bent-wire element as the biasing member 148. It may be noted that other types of elastic elements, such as, the coil springs, rubber locks may also be employed in the connector assembly 110 as the biasing member 148 without limiting the scope of the present application. Moreover, while the biasing member 148 is shown to be a u-shaped bent-wire element, the bent-wire element may be in any suitable configuration capable of applying the biasing force on the connector 120. In some examples, the connector housing 130 may include a retaining structure 150 (see FIGS. 10A and 10B) formed in the connector housing portion 154 to restrict a movement of the biasing member 148. The retaining structure 150 may be a protruding wall within the connector housing 130.

Referring now to FIGS. 10A and 10B, the connector housing portion 154 may include internal guideways 151 to retain the biasing member 148 inside the connector housing 130. The internal guideways 151 may be formed adjacent to the retaining structure 150. In one example, the internal guideways 151 are formed such that the internal guideways 151 terminate at the retaining structure 150. In particular, the biasing member 148 is disposed in the connector housing 130 via the internal guideways 151 such that ends 152 of the biasing member 148 face the retaining structure 150. For example, the biasing member 148 may be inserted into the connector housing portion 154 by sliding the biasing member 148 into the internal guideways 151 in a direction 153. Upon insertion into the internal guideways 151, the biasing member 148 may be compressed at side edges 155 due to contact with a surface of the internal guideways 151. Further, due to its spring action, the biasing member 148 may also apply an outward force on the surface of the internal guideways 151 through the side edges 155. In particular, such contact forces between the biasing member 148 and the internal guideways may aid in retaining the biasing member 148 in the connector housing 130. Further, the biasing member 148 may be inserted into the guideways 151 such that the ends 152 may face/touch the retaining structure 150 upon insertion and a portion 156 of the biasing member 148 may remain outside of the guideways 151 thereby resulting in an assembly depicted in FIG. 10B.

Referring now to FIG. 11 an internal cross-sectional perspective view 1100 of the connector assembly 110 showing the positioning arrangement of the biasing member 148 is depicted, in accordance with one example. In the cross-sectional perspective view 1100 of FIG. 11, the connector housing portion 154 is not shown for aiding better visibility of positioning of the biasing member 148 with respect to the connector body 122. The biasing member 148 may be disposed in the connector assembly 110 such that a biasing force exerted by the biasing member 148 is applied on the connector 120 in a direction toward the receiving structure 112 when the connecting device 104 is installed on the motherboard 106. The biasing member 148 may be disposed in such a way that the portion 156 of the biasing member 148 may contact the connector body 122 and apply the biasing force on the connector body 122 when the connecting device 104 is installed on the motherboard 106. In particular, when the connecting device 104 is installed on the motherboard 106, the connector body 122 may tend to move upward thereby compressing the biasing member 148. The ends 152 of the biasing member 148 in-turn receive a force from the retaining structure 150 when the biasing member is compressed via the connector body 122. Consequently, a biasing force may be applied back on the connector body 122 by the biasing member 148 via the portion 156 thereby keeping the connector body 122 forced toward the receiving structure 112 on the motherboard 106.

In some examples, in order to minimize or avoid excessive force being applied on the receiving structure 112 by the connector 120 and to retain the connector body 122 within the connector housing 130, the connector housing 130 may include movement limiter slot 158 that restricts the movement of the connector 120 toward the receiving structure 112 caused due to the biasing force applied by the biasing member 148. Further, to aid in such feature of limiting the movement of the connector 120, the connector 120 may also include a protruded wall section 160. The protruded wall section 160 may be formed on the connector body 122. The protruded wall section 160 may encounter the movement limiter slot 158 and movement of the connector 120 beyond the movement limiter slot 158 may be restricted.

Figure 12:
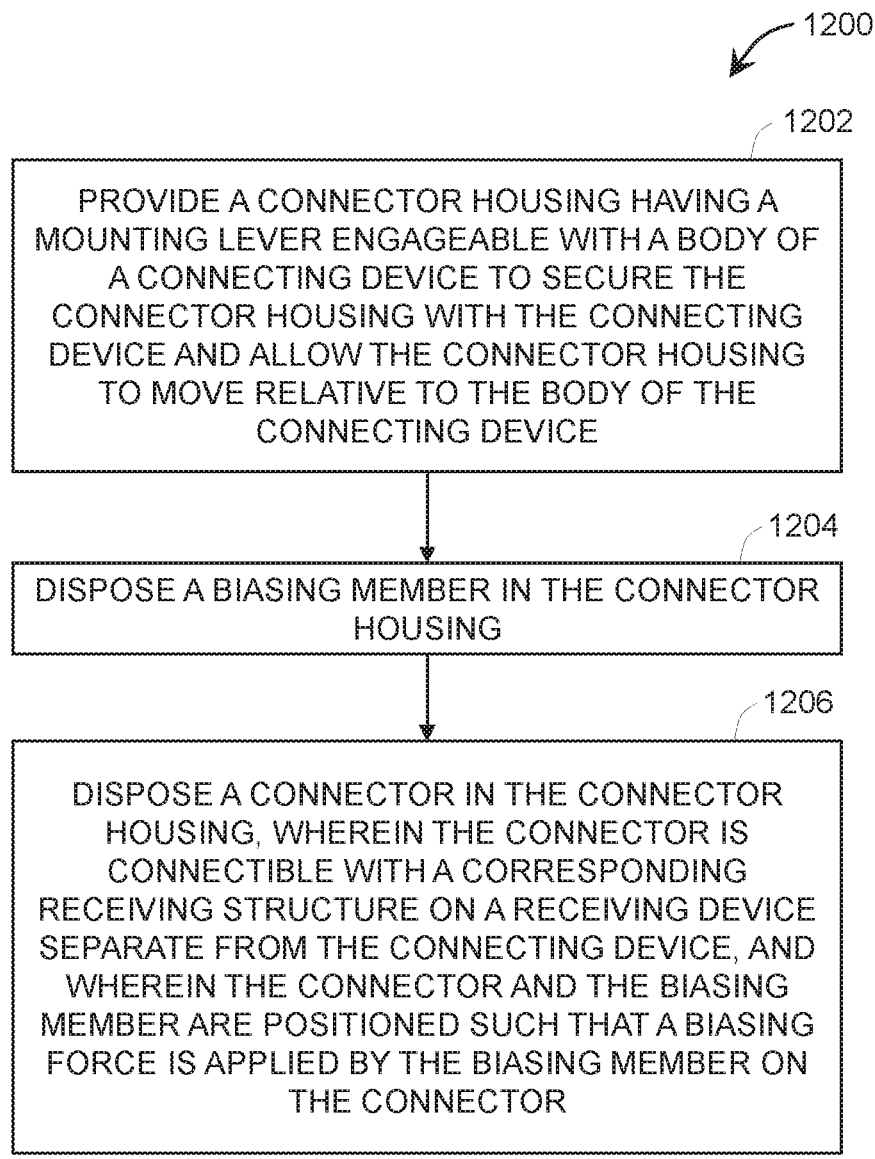
FIG. 12 depicts a flow diagram of a method for forming a connector assembly, in accordance with one example.

Referring now to FIG. 12, a flow diagram of a method 1200 for forming a connector assembly, such as the connector assembly 110 is presented, in accordance with one example. For ease of illustration, the method 1200 of FIG. 12 will be described in conjunction with the preceding FIGS. 1-11.

At block 1202, a connector housing such as the connector housing 130 may be provided. As previously noted, the connector housing 130 may include the mounting lever 132 that is engageable with the body 114 of the connecting device 104 to secure the connector housing 130 with the connecting device 104 and allow the connector housing 130 to move relative to the body 114 of the connecting device 104. Moreover, at block 1204, a biasing member such as the biasing member 148 may be disposed in the connector housing 130. In some examples, disposing the biasing member 148 may include sliding the biasing member 148 into the internal guideways 151 formed in the connector housing 130 such that ends 152 of the biasing member 148 face the retaining structure 150 formed in the connector housing 130 (see FIG. 10B) and the portion 156 of the biasing member 148 may remain outside the internal guideways 151.

Further, at block 1206, a connector such as the connector 120 may be disposed in the connector housing 130. The connector 120 is connectible with the corresponding receiving structure 112 on the receiving device 102. In some examples, the connector 120 may be disposed in the connector housing 130 by inserting the connector body 122 in a cavity defined by the connector housing 130. In some examples, the connector 120 and the biasing member 148 are positioned such that the connector 120 is biased toward the receiving structure 112 on the receiving device 102 when the connecting device 104 is installed on the motherboard 106 of the receiving device 102.

The connector assembly 110, in accordance with various aspects of the present disclosure, is movable relative to the body 114 of the connecting device 104 that can reduce any wear and tear or damages to the connector 120 and/or the receiving structure 112 on the receiving device 102. Additionally, use of the biasing member 148 may ensure a tight coupling between the connector 120 and the receiving structure 112 when the connecting device 104 is installed in the receiving device 102. Further, as will be appreciated, use of the connector assembly 110 enables the connector 120 to be connected to the receiving structure 112 without requiring a separate manual connection of the connector 120. Moreover, use of the connector assembly 110 may enable tool less secure coupling of the connector 120 with the receiving structure 112.

While certain implementations have been shown and described above, various changes in form and details may be made. For example, some features and/or functions that have been described in relation to one implementation and/or process may be related to other implementations. In other words, processes, features, components, and/or properties described in relation to one implementation may be useful in other implementations. Furthermore, it should be appreciated that the systems and methods described herein may include various combinations and/or sub-combinations of the components and/or features of the different implementations described.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A connector assembly for a connecting device, comprising:
   a connector connectible with a receiving structure on a receiving device separate from the connecting device;
   a connector housing enclosing the connector, wherein the connector housing comprises a mounting lever engaged with a body of the connecting device to secure the connector housing with the connecting device and allow the connector housing to move relative to the body of the connecting device; and
   a biasing member to bias the connector toward the receiving structure on the receiving device, wherein the biasing member is disposed in the connector housing such that at least a portion of the biasing member is placed in contact with the connector to apply biasing force on the connector.

2. The connector assembly of claim 1, wherein the mounting lever comprises an end section movably coupled with the body of the connecting device.

3. The connector assembly of claim 2, wherein the end section of the mounting lever is a cylindrical end section, wherein the cylindrical end section is inserted into a cylindrical groove in the body of the connecting device to cause engagement of the connector housing with the body of the connecting device while allowing the connector housing to move within the cylindrical groove.

4. The connector assembly of claim 2, wherein the end section of the mounting lever is coupled to the body of the connecting device using a fixture passing via an opening in the end section to the body of the connecting device, wherein the end section is coupled to the body of the connecting device via the fixture while allowing an angular movement of the connector housing with respect to the fixture.

5. The connector assembly of claim 1, wherein the connector housing further comprises a latch lever on an opposite side of the mounting lever, wherein the latch lever is removably snap-fitted to the body of the connecting device.

6. The connector assembly of claim 1, wherein the biasing member comprises one or more coil springs, one or more bent wires, rubber blocks, or combinations thereof.

7. The connector assembly of claim 1, wherein the connector housing comprises a retaining structure and internal guideways to secure the biasing member inside the connector housing.

8. The connector assembly of claim 7, wherein the biasing member is disposed in the connector housing via the internal guideways such that ends of the biasing member face the retaining structure.

9. The connector assembly of claim 1, wherein:
   the connector comprises a protruded wall section; and
   the connector housing further comprises a slot to restrict a movement of the connector caused due to biasing force applied by the biasing member by causing a contact between a wall of the slot and the protruded wall section of the connector.

10. The connector assembly of claim 1, wherein the connector is an electrical connector comprising a plurality of electrically conductive fingers that physically contact corresponding receptacles in the receiving structure when the electrical connector is connected to the receiving structure.

11. The connector assembly of claim 10, wherein the electrical connector is a TA-1002 type connector.

12. The connector assembly of claim 10, wherein the connecting device is a storage module comprising a plurality of storage devices, and wherein the electrical connector is coupled to at least one storage device of the plurality of storage devices to facilitate data transfer for the at least one storage device.

13. The connector assembly of claim 10, wherein the electrical connector is a male type connector and the receiving structure is a female-type receiver socket.

14. A method for forming a connector assembly for a connecting device, comprising:
   providing a connector housing comprising a mounting lever engageable with a body of the connecting device to secure the connector housing with the connecting device and allow the connector housing to move relative to the body of the connecting device;
   disposing a biasing member in the connector housing; and
   disposing a connector in the connector housing, wherein the connector is connectible with a receiving structure on a receiving device separate from the connecting device, and wherein the connector and the biasing member are positioned such that a biasing force is applied by the biasing member on the connector, wherein disposing the biasing member comprises sliding the biasing member into internal guideways formed in the connector housing such that ends of the biasing member face a retaining structure formed in the connector housing.

15. The method of claim 14, further comprising engaging the mounting lever with the body of the connecting device via an end section of the mounting lever.

16. The method of claim 14, wherein the biasing member is disposed in the connector housing such that at least a portion of the biasing member contacts with body of the connector.

17. A system comprising:
   a receiving device comprising a motherboard having a receiving structure; and
   a connecting device removably connectible to the motherboard, wherein the connecting device comprises a connector assembly comprising:
   a connector connectible with the receiving structure;
   a connector housing enclosing the connector, wherein the connector housing comprises a mounting lever engaged with a body of the connecting device to secure the connector housing with the connecting device and allow the connector housing to move relative to the body of the connecting device; and
   a biasing member disposed in the connector housing to bias the connector toward the receiving structure on the receiving device.

18. The system of claim 17, wherein the connector is an electrical connector comprising a plurality of electrically conductive fingers that physically contact receptacles in the receiving structure when the electrical connector is connected to the receiving structure.

19. The system of claim 17, wherein the connector housing comprises a retaining structure and internal guideways to secure the biasing member inside the connector housing, wherein the biasing member is disposed in the connector housing via the internal guideways such that ends of the biasing member face the retaining structure.

20. The system of claim 17, wherein the connector housing further comprises a latch lever on an opposite side of the mounting lever, wherein the latch lever is removably snap-fitted to the body of the connecting device.

\* \* \* \* \*